US008547092B2

(12) United States Patent
Jung et al.

(10) Patent No.: US 8,547,092 B2
(45) Date of Patent: Oct. 1, 2013

(54) PROTON PRECESSION MAGNETOMETER SENSOR MEASURABLE IN ALL DIRECTION (75) Inventors: Hyun Key Jung, Daejeon (KR); Mu Taek Lim, Daejeon (KR); Jeongsul Son, Daejeon (KR); Hyong Rea Rim, Daejeon (KR)

(73) Assignee: Korea Institute of Geoscience & Mineral Resources, Daejeon (KR)

( * ) Notice: Subject to any disclaimer, the term of this patent is extended or adjusted under 35 U.S.C. 154(b) by 498 days.

(21) Appl. No.: 12/666,153

(22) PCT Filed: Dec. 23, 2008

(86) PCT No.: PCT/KR2008/007603
§ 371 (c)(1),
(2), (4) Date: Dec. 22, 2009

(87) PCT Pub. No.: WO2010/074357
PCT Pub. Date: Jul. 1, 2010

(65) Prior Publication Data
US 2011/0074408 A1    Mar. 31, 2011

(30) Foreign Application Priority Data
Dec. 22, 2008    (KR) ........................ 10-2008-0131535

(51) Int. Cl.
*G01V 3/00*    (2006.01)
*G01V 3/10*    (2006.01)
(52) U.S. Cl.
USPC ............ 324/301; 324/318; 324/321; 324/322
(58) Field of Classification Search
USPC ................................................ 324/300–322
See application file for complete search history.

(56) References Cited

U.S. PATENT DOCUMENTS

| 3,070,745 | A | * | 12/1962 | Serson ........................ 324/301 |
| 3,443,207 | A | * | 5/1969 | Feild ............................ 324/301 |
| 3,546,574 | A | * | 12/1970 | Grimm et al. ................ 324/301 |
| 3,735,246 | A |   | 5/1973 | Glenat et al. |

(Continued)

FOREIGN PATENT DOCUMENTS
GB        1471017        4/1977

OTHER PUBLICATIONS
International Search Report for corresponding PCT Application No. PCT/KR2008/007603, dated Nov. 29, 2010.

*Primary Examiner* — Jermele M Hollington
*Assistant Examiner* — Emily Chan
(74) *Attorney, Agent, or Firm* — Caesar, Rivise, Bernstein, Cohen & Pokotilow, Ltd.

(57) ABSTRACT

A "proton precession magnetometer sensor capable of all-direction measurement" according to the present invention, in which frequency of current induced in a coil by flowing and then breaking current in the coil is measured to calculate strength of an external magnetic field, is characterized in that the coil is a toroid coil. Alternatively, the coil may be achieved by two solenoid coils connected perpendicularly, or N solenoid coils connected in the form of a polygon, where N is an integer of 3 or more. The proton precession magnetometer sensor is capable of measuring the external magnetic field in all directions since there is no dead band, and is convenient since there is no need of adjusting the sensor to a certain direction when measuring magnetic force. Further, the present invention will bring accumulation of key original technology applicable to various cases in practice through development of improved impedance matching and power consumption optimization in future practice.

2 Claims, 6 Drawing Sheets

(56) References Cited

U.S. PATENT DOCUMENTS

| | | | |
|---|---|---|---|
| 3,886,440 A * | 5/1975 | Berry et al. | 324/301 |
| 4,395,762 A * | 7/1983 | Wondergem et al. | 702/78 |
| 4,546,317 A | 10/1985 | Hinton | |
| 7,271,592 B1 * | 9/2007 | Gerald et al. | 324/321 |

* cited by examiner

PROTON PRECESSION MAGNETOMETER SENSOR MEASURABLE IN ALL DIRECTION

BACKGROUND OF THE INVENTION

1. Field of Invention

The present invention relates to a proton precession magnetometer sensor which senses strength of a magnetic field by measuring frequency of current induced in a coil due to a break of strong current after flowing the strong current in the coil.

2. Description of Related Art

In geophysical prospecting, a magnetic survey is a method that provides fundamental and important information for a reconnaissance survey and a detail survey. To this end, a 3-axis fluxgate magnetometer, a proton precession magnetometer, an Overhauser effect magnetometer, an optical-pumping magnetometer, etc. are employed as a magnetometer for surface and aerial surveys.

The fluxgate magnetometer is capable of measuring vector components, but its temperature drift characteristic or orthogonality is not precise. The Overhauser effect magnetometer is experimentally vulnerable to ambient noise such as 60 Hz power line or the like. The optical-pumping magnetometer is inconvenient in that it needs direct-tuning of a manufacturer again for replacement since a current technology level cannot strictly predict a lifespan of an internal lamp.

Meanwhile, the proton precession magnetometer measures a total magnetic field on the basis of an accurate frequency count, so that a precise magnetic field can be obtained as long as a reference oscillation frequency has a good temperature characteristic. Together with an aeromagnetic survey, the proton precession magnetometer has been widely used in the world.

However, such methods for measuring a magnetic field using the principle of proton precession has a limit that a low-sensitivity angle (i.e., a dead band) exists at a certain direction where the measurement is not impossible. The principle of the proton precession is as follows.

An atomic nucleus, i.e., a proton has a spin, that is, properties of the quantum mechanics. The spin of the proton has a magnetic quantum number depending on quantized angular momentum and has a certain orientation. If the proton does not have a total spin quantum number of "0" like $^1$H(proton) or $^{13}$C, it has magnetic susceptibility. The proton has a spin of ½ and its possible spin states are m=±½. Like this, different states having the same energy level are called superposition. These two different states have the same population under thermal equilibrium, but the superposition is broken when a strong magnetic field is applied to the proton. Thus, the magnetic moment of the proton is aligned with the direction of the applied magnetic field. At this time, if the applied magnetic field is removed, the earth's magnetic field has an effect on the magnetic moment of the proton and thus the proton precesses when the earth's magnetic field acts in a nonparallel direction to the magnetic moment of the proton as given in the following expression 1. Here, a component of the earth's magnetic field, which is orthogonal to the magnetic moment of the proton, causes the precession. In conclusion, the earth's magnetic field should not be parallel with the magnetic moment of the proton as shown in the following expression 1 to cause the precession (for example, there is no precession when an angle between the magnetic moment of the proton and the earth's magnetic field is "0" or "180" degrees).

$$\text{dir}(\vec{H}_{ear}) \not\parallel \text{dir}(\vec{H}_{exc}) \qquad \text{[Expression 1]}$$

The precession is a phenomenon that a rotation axis of a spinning body turns around a stationary axis, which is caused as moment of weak external force acts orthogonally. As an example of the precession, there is the earth's rotation axis, a rotation axis of a satellite, etc. Meanwhile, the atomic nucleus, i.e., the proton has the magnetic moment depending on the spin quantum number, and precesses with regard to a component of a weak external magnetic field (e.g., the earth's magnetic field) orthogonal to the magnetic moment if the external magnetic field acts in a different direction to the magnetic moment. Here, the frequency ($f_{prec}$) of the precession is in proportion to the strength ($H_{ear}$) of the external magnetic field.

The proton precession magnetometer uses the foregoing principle, in which frequency (this is equal to the frequency ($f_{prec}$) of the precession) of current induced in a solenoid coil by flowing and then breaking current in the solenoid coil is measured to calculate the strength of the external magnetic field. That is, if the strong current flows in the solenoid coil, a magnetic field is created inside the solenoid coil in a direction of penetrating the solenoid coil. This magnetic field makes the magnetic moment of the proton inside the solenoid coil be aligned with the direction of the applied magnetic field (i.e., the direction of penetrating the solenoid coil). At this time, if the current is broken, the magnetic moment of the proton is affected by the earth's magnetic field, so that the proton can precess.

As shown in the expression 1, the precession arises when the magnetic moment of the proton and the earth's magnetic field are not parallel with each other. On the other hand, as shown in the following expression 2, if the magnetic moment of the proton and the earth's magnetic field are parallel with each other, for example, if the earth's magnetic field is in parallel with a direction of penetrating a solenoid coil of a proton precession magnetometer sensor, the precession is not caused since there is no external force that moves the axis of the magnetic moment of the proton, and therefore it is impossible to measure the strength of the earth's magnetic field.

$$\text{dir}(\vec{H}_{ear}) \| \text{dir}(\vec{H}_{exc}) \qquad \text{[Expression 2]}$$

Substantially, induced voltage has the highest amplitude in a direction where the magnetic moment of the proton is orthogonal to the earth's magnetic field. On the other hand, the induced voltage decreases as the two magnetic fields get more parallel with each other, and therefore it is difficult to measure the frequency. In other words, a conventional proton precession magnetometer has a limit that a low-sensitivity angle (i.e., a dead band) exists at a certain direction where the measurement is not impossible. Accordingly, the conventional proton precession magnetometer needs a position adjustment of a sensor to make the magnetic field inside the solenoid coil be orthogonal to the earth's magnetic field when measuring the earth's magnetic field.

BRIEF SUMMARY OF THE INVENTION

To solve the above described problems, an aspect of the present invention is to provide a proton precession magnetometer sensor in which measurement is possible in all directions since there is no low-sensitivity angle (i.e., there is no dead band).

A proton precession magnetometer sensor, in which frequency of current induced in a coil by flowing and then breaking current in the coil is measured to calculate strength of an external magnetic field, may be characterized in that the coil is a toroid coil to measure the magnetic field in all direction. Alternatively, the coil may be achieved by two solenoid coils connected perpendicularly, or N solenoid coils connected in the form of a polygon, where N is an integer of 3 or more.

In the proton precession magnetometer sensor, the coil is put in a nonmagnetic container filed with a hydrocarbon solvent and connected to a measuring device. The measuring device includes a counter to measure frequency of current induced in the coil; a current source to supply current to the coil; and a relay to open and close for current supplied to the coil.

According to an exemplary embodiment of the present invention, a proton precession magnetometer sensor can measure an external magnetic field in all directions because there is no dead band. Therefore, it is convenient to measure the external magnetic field because there is no need of adjusting the sensor to a certain direction when measuring magnetic force.

Further, this research will result in accumulation of key original technology applicable to various cases in practice through development of improved impedance matching and power consumption optimization in future practice.

DETAILED DESCRIPTION OF THE INVENTION

Hereinafter, exemplary embodiments of the present invention will be described with reference to accompanying drawings. However, the present invention is not limited to the embodiments set forth herein and may be embodied in different forms. Rather, the embodiments introduced herein are provided so that disclosed contents will be thorough and complete, and will fully convey the spirit of the invention to those skilled in the art. Like numbers refer to like elements throughout the figures.

Figure 1:
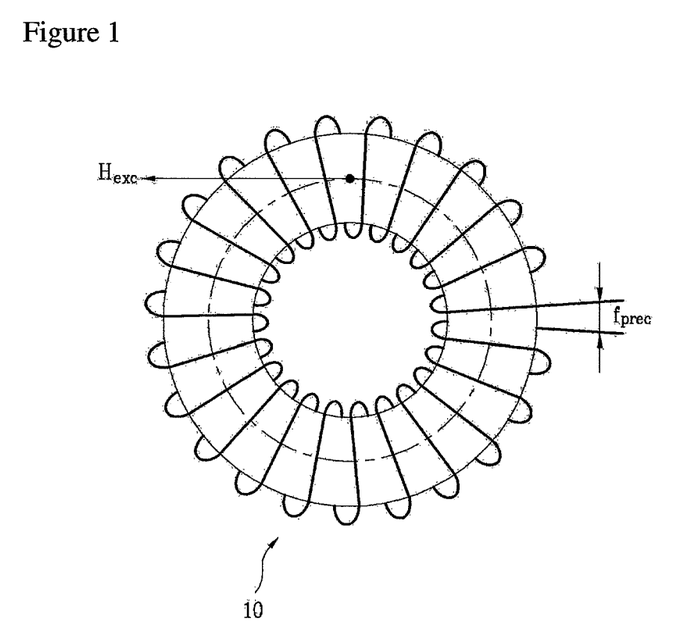
FIG. 1 is a schematic view of a proton precession magnetometer sensor capable of all-direction measurement according to an exemplary embodiment of the present invention.

FIG. 1 is a schematic view of a proton precession magnetometer sensor capable of all-direction measurement according to an exemplary embodiment of the present invention. As shown therein, a proton precession magnetometer sensor 10 according to an exemplary embodiment of the present invention employs a toroid coil 12 as a coil, in which frequency (this is equal to frequency ($f_{prec}$) of precession of a proton) of current induced in the toroid coil 12 is measured to calculate the strength of the earth's magnetic field on the basis of the following expression 3.

$$H_{ear} = \frac{2\pi f_{prec}}{\gamma_p} \quad \text{[Expression 3]}$$

where, $H_{ear}$ is the strength of the earth's magnetic field, $f_{prec}$ is the frequency of the precession, and $\gamma_p$ is gyromagnetic ratio of the proton.

If current flows in the toroid coil 12, a magnetic field is created inside the toroid coil 12, in which the strength of the magnetic field is in inverse proportion to a distance from the core and the direction of the magnetic field is the same as a forward-moving direction of a screw when the screw is turned along a flowing direction of the current. Further, the magnetic field turns inside the toroid coil 12 in a circle, and the direction of the magnetic field at a certain position inside the toroid coil is a tangential direction as shown in FIG. 1. Thus, the direction of the magnetic field generated inside the toroid coil 12 varies depending on the positions of the same circumference.

If a strong magnetic field is generated inside the toroid coil 12 by flowing the current in the toroid coil 12, magnetic moment $H_{exc}$ of a proton existing inside the toroid coil 12 becomes aligned with the direction of the internal magnetic field through an excitation stage. As described above, because the directions of the magnetic field created inside the toroid coil 12 varies depending on the positions of the same circumference, the directions of the magnetic moment of the proton are also varied depending on the positions of the same circumference.

In this regard, when the current applied to the coil is broken and an external magnetic field such as the earth's magnetic field $H_{ear}$ acts, most protons, which satisfy the expression 1 with regard to the earth's magnetic field $H_{ear}$, exist certainly at arbitrary positions inside the toroid coil 12 regardless of the direction of the sensor. Thus, contrary to a conventional solenoid coil, the proton precesses regardless of the direction of the sensor, so that the strength of the earth's magnetic field can be measured in all directions.

Figure 2:
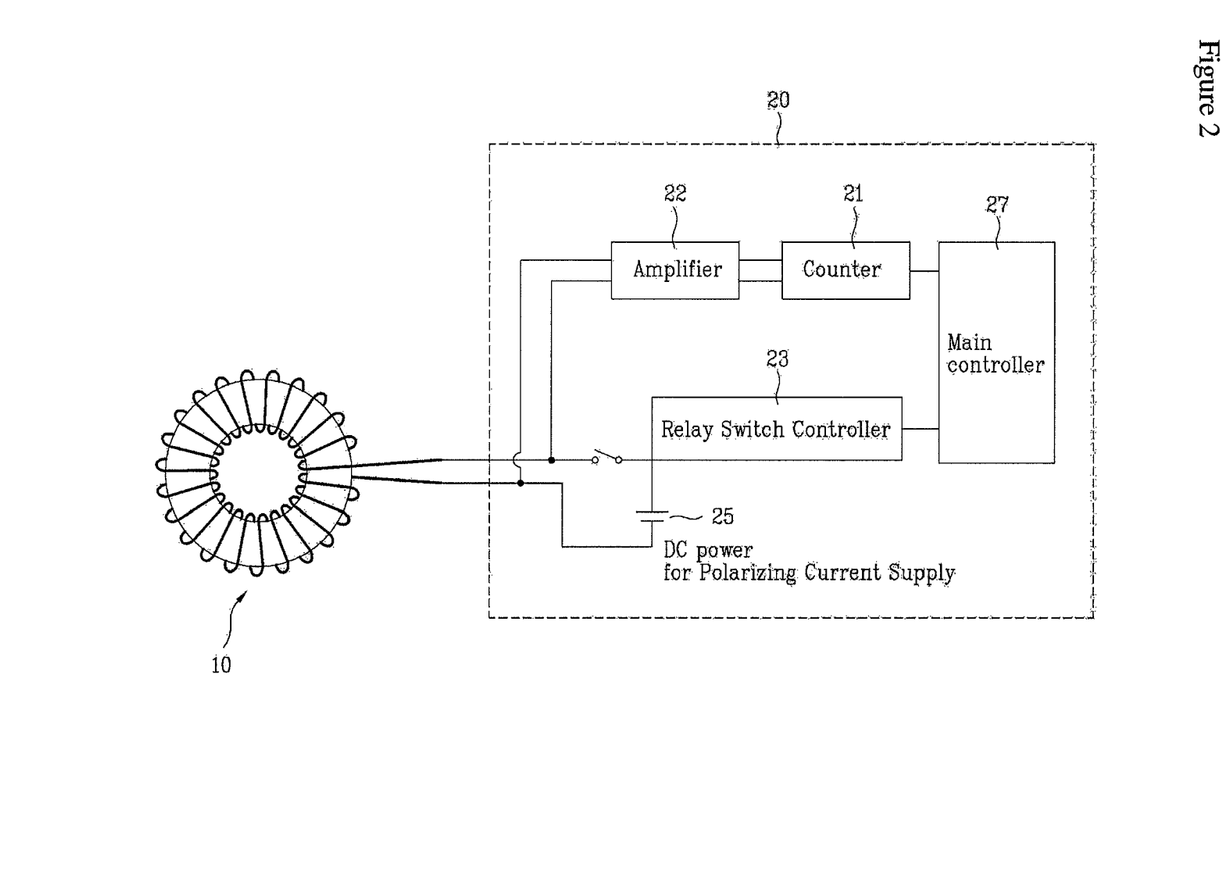
FIG. 2 is a block diagram of the proton precession magnetometer sensor capable of the all-direction measurement according to an exemplary embodiment of the present invention.

FIG. 2 is a block diagram of the proton precession magnetometer sensor capable of the all-direction measurement according to an exemplary embodiment of the present invention. The proton precession magnetometer sensor 10 capable of the all-direction measurement according to an exemplary embodiment of the present invention employs a measuring device 20 connected to the toroid coil 12. The measuring device 20 includes an amplifier 22 to amplify the current induced in the coil due to the precession of the proton, a counter 21 to measure frequency of an amplified signal, a current source 25 to supply current to the coil, a relay to open and close for the current supplied to the coil, and a main controller 27 to control them. Further, the relay includes a switch and a relay switching controller 23.

Referring to FIG. 2, the proton precession magnetometer sensor 10 capable of the all-direction measurement according to an exemplary embodiment of the present invention will be described below.

First, the current source 25 applies the current to the toroid coil 12. The current applied to the toroid coil 12 induces a strong magnetic field inside the toroid coil 12, and the strong magnetic field makes the proton inside the toroid coil 12 become a stationary state in which the magnetic moment of the proton is rearranged in the same direction as the magnetic field $H_{exc}$ via the excitation state.

When the proton inside the toroid coil 12 becomes the stationary state, the relay 23 breaks the current applied to the toroid coil 12. Then, the earth's magnetic field acts on the proton that exists inside the toroid coil 12, so that most protons inside the toroid coil 12 can satisfy the condition of the expression 1 regardless of the direction of the sensor or the direction of the earth' magnetic field, thereby precessing with respect to the direction of the earth's magnetic field.

Due to the precession of the proton, alternating current with the same frequency as the frequency $f_{prec}$ of the precession of the proton is induced in the toroid coil 12. The counter 21 measures the frequency of the current induced in the toroid coil 12. In the counter 21, the frequency may be measured in such a manner that amplitude and direction change of voltage induced in the toroid coil 12 is counted for a predetermined time. Here, the change of voltage is considered for counting the frequency since the current is relatively weak.

The measured frequency $f_{prec}$ of the precession of the proton is transformed into the strength of the earth's magnetic field through an operator (not shown) based on the expression 3, and displayed on a display device (not shown).

Figure 3:
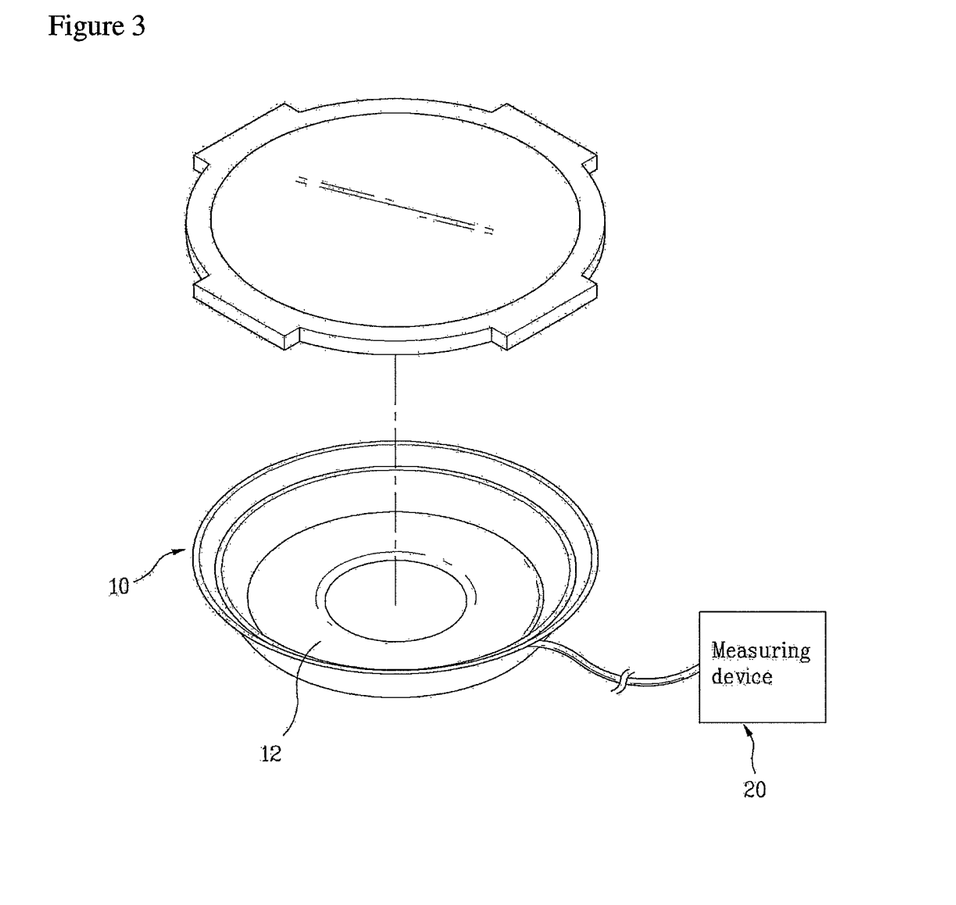
FIG. 3 is a perspective view of the proton precession magnetometer sensor capable of the all-direction measurement according to an exemplary embodiment of the present invention.

FIG. 3 is a perspective view of the proton precession magnetometer sensor capable of the all-direction measurement according to an exemplary embodiment of the present invention. In the proton precession magnetometer sensor 10 capable of the all-direction measurement according to an exemplary embodiment of the present invention, the toroid coil 12 is put in a nonmagnetic container filed with a hydrocarbon solvent, and connected to the measuring device 20. The toroid coil 12 is put as being coated, and FIG. 3 shows the coated toroid coil 12. As an example of the hydrocarbon solvent, kerosene is preferable, but not limited thereto. Alternatively, another solvent may be used as long as it sufficiently contains separated protons and the other contained chemical elements have a total spin quantum number of "0".

As shown therein, the proton precession magnetometer sensor capable of the all-direction measurement is convenient to carry since it has a simple structure, and is connectable to the measuring device 20 at anytime and anywhere to thereby measure magnetic force.

Figure 4:
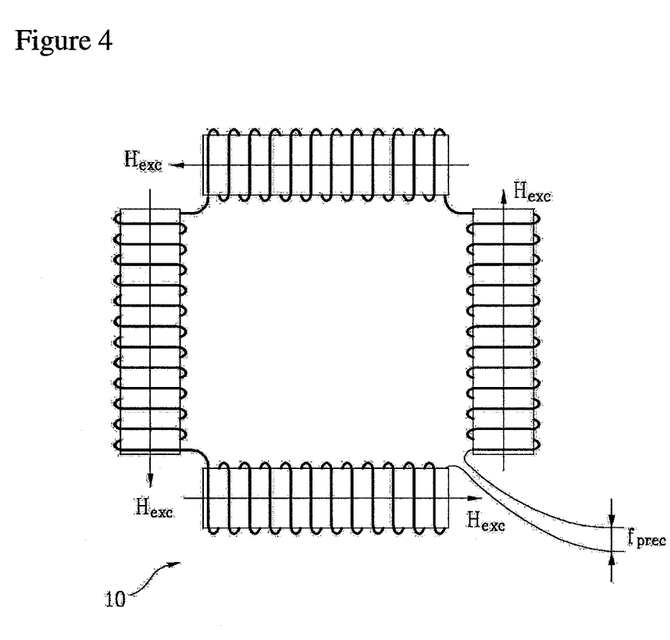
FIG. 4 is a schematic view of a proton precession magnetometer sensor capable of all-direction measurement according to another exemplary embodiment of the present invention.
Figure 5:
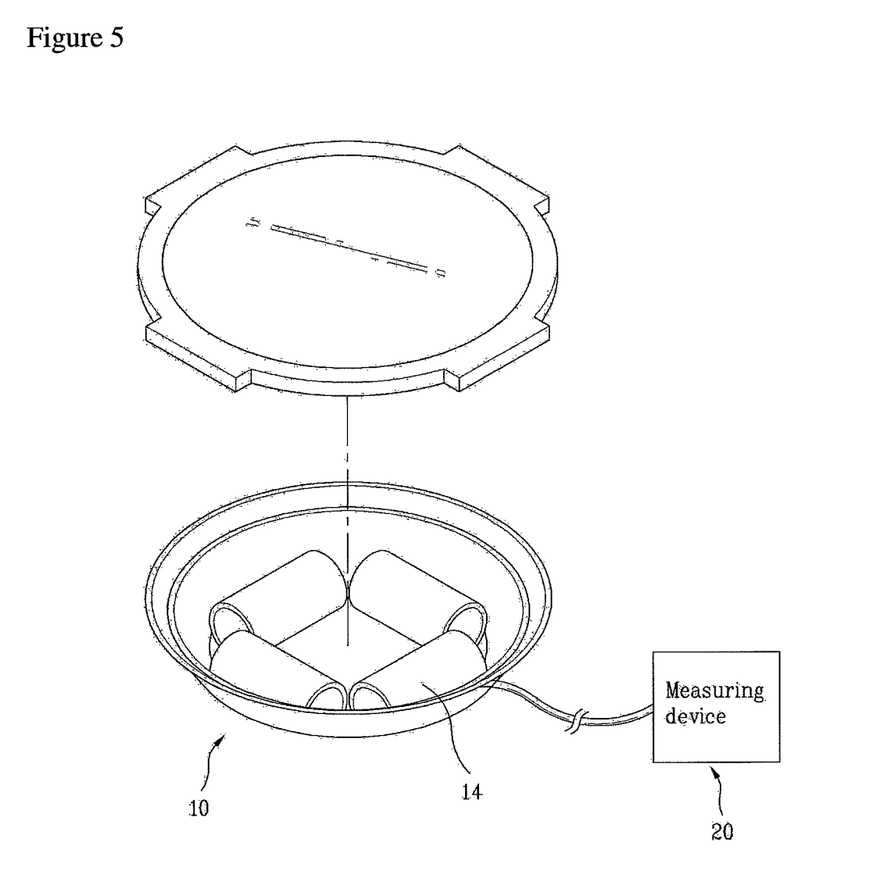
FIG. 5 is a perspective view of the proton precession magnetometer sensor capable of the all-direction measurement according to another exemplary embodiment of the present invention.

FIG. 4 is a schematic view of a proton precession magnetometer sensor capable of all-direction measurement according to another exemplary embodiment of the present invention, and FIG. 5 is a perspective view of the proton precession magnetometer sensor by way of example.

The proton precession magnetometer sensor capable of the all-direction measurement according to an exemplary embodiment of the present invention may be manufactured by connecting N solenoid coils in the form of a polygon besides the foregoing toroid-shaped coil, where N is an integer of 3 or more. In the case of two solenoid coils, they may be connected perpendicularly so that a low-sensitivity angle (i.e., a dead band) can be reduced. For example, FIG. 4 shows a schematic view of four solenoid coils 14 connected in a rectangular type, and FIG. 5 shows a perspective view of a sensor according to this embodiment. In this case, it is possible to eliminate the dead band where measurement of the earth's magnetic field is difficult.

Figure 6:
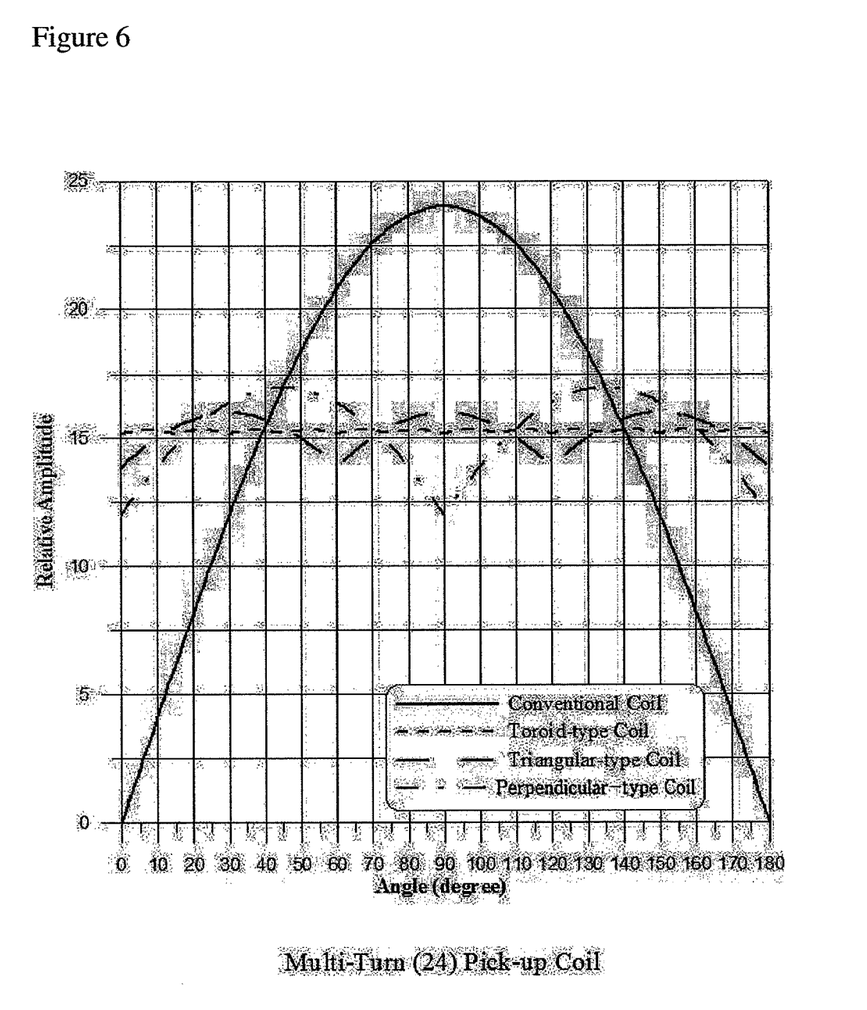
FIG. 6 is a graph showing a comparison of measurement results between a conventional proton precession magnetometer sensor and the proton precession magnetometer sensors according to the exemplary embodiments of the present invention.

FIG. 6 is a graph showing a comparison of measurement results between a conventional proton precession magnetometer sensor and the proton precession magnetometer sensors according to the exemplary embodiments of the present invention. In FIG. 6, a horizontal axis refers to an angle corresponding to position change of the sensor, a vertical axis refers to an amplitude of voltage included in the coil, and a graph shows a relative amplitude of a measured value according to the angles in the case of using a 24-turn coil.

As shown in FIG. 6, a conventional solenoid coil has the dead band where it is difficult to measure the earth's magnetic field since the amplitude of the induced voltage decreases rapidly as the sensor becomes more parallel with the direction of the earth's magnetic field while the voltage is strongly induced in a direction where the magnetic moment of the proton is orthogonal to the direction of the earth's magnetic field.

On the other hand, the solenoid coils connected in a perpendicular type reduces the dead band significantly as compared with the conventional one, three solenoid coils connected in the triangular type further reduces the dead band, and the toroid type coil shows no dead band.

That is, it is experimentally verified that the dead band further decreases as more N (N=2, 3, 4, . . . , $\infty$) coils are connected in the form of a polygon, and no dead band exists in the utmost form, i.e., in the toroid shape.

As described above, various exemplary embodiments have been described with the drawings and the specifications. For reference, terms employed herein are not used for narrowing the meaning and limiting the scope of the invention. Accordingly, it will be appreciated by those skilled in the art that changes may be made in these exemplary embodiments without departing from the principles and spirit of the invention, the scope of which is defined in the appended claims and their equivalents.

The present invention provides a proton precession magnetometer sensor capable of all-direction measurement and will result in accumulation of key original technology applicable to various cases in practice through development of improved impedance matching and power consumption optimization in future practice.

What is claimed is:

1. A proton precession magnetometer sensor, comprising a coil including two solenoid coils connected perpendicularly or N solenoid coils connected in the form of a polygon, where N is an integer of 3 or more to, to measure the magnetic field in all directions, in which frequency of current induced in the coil by flowing and then breaking current in the coil is measured to calculate strength of an external magnetic field by a calculation unit, the coil put in a nonmagnetic container filed with a hydrocarbon solvent and connected to a measuring device, the measuring device including a counter to measure frequency of current induced in the coil;

a current source to supply current to the coil; and a relay to open and close for current supplied to the coil.

2. The proton precession magnetometer sensor of claim 1, said calculating unit adapted to calculate the strength of the external magnetic field based on the frequency of current measured by the counter.

* * * * *